(12) United States Patent
Tepper et al.

(10) Patent No.: US 12,006,574 B2
(45) Date of Patent: Jun. 11, 2024

(54) LOW TEMPERATURE FORMATION OF PEROVSKITE FILMS IN SUPERCRITICAL FLUIDS

(71) Applicant: VIRGINIA COMMONWEALTH UNIVERSITY, Richmond, VA (US)

(72) Inventors: Gary Tepper, Henrico, VA (US); Gilbert Annohene, Richmond, VA (US)

(73) Assignee: VIRGINIA COMMONWEALTH UNIVERSITY, Richmond, VA (US)

( * ) Notice: Subject to any disclaimer, the term of this patent is extended or adjusted under 35 U.S.C. 154(b) by 0 days.

(21) Appl. No.: 17/604,512

(22) PCT Filed: Feb. 27, 2020

(86) PCT No.: PCT/US2020/020011
§ 371 (c)(1),
(2) Date: Oct. 18, 2021

(87) PCT Pub. No.: WO2020/214247
PCT Pub. Date: Oct. 22, 2020

(65) Prior Publication Data
US 2022/0205106 A1 Jun. 30, 2022

Related U.S. Application Data

(60) Provisional application No. 62/905,511, filed on Sep. 25, 2019, provisional application No. 62/835,522, filed on Apr. 18, 2019.

(51) Int. Cl.
C23C 18/12 (2006.01)
H10K 71/15 (2023.01)

(52) U.S. Cl.
CPC ........ *C23C 18/1204* (2013.01); *C23C 18/125* (2013.01); *H10K 71/15* (2023.02)

(58) Field of Classification Search
CPC .... C23C 18/1204; C23C 18/125; H10K 71/15
See application file for complete search history.

(56) References Cited

U.S. PATENT DOCUMENTS

2015/0279573 A1* 10/2015 Horiuchi .............. H01G 9/2059
136/263

FOREIGN PATENT DOCUMENTS

WO 2018/015831 A1 1/2018
WO WO-2018015831 A1 * 1/2018 .............. C07F 7/003

* cited by examiner

*Primary Examiner* — Hai Y Zhang
(74) *Attorney, Agent, or Firm* — WC&F IP (57) ABSTRACT

Crystallization of perovskite films was performed in supercritical carbon dioxide with and without organic co-solvents. Post deposition crystallization of the films was performed in a binary, single phase supercritical fluid at constant conditions (45° C., 1200 psi) but with varying organic co-solvent volume fractions up to 2%. The co-solvents can provide selective interactions with one or both of the perovskite precursor compounds resulting in different film morphologies ranging from uniform films containing large grains to films exhibiting large cubic or hexagonal crystals or preferential crystallographic orientations. The use of supercritical fluids to enhance or tune crystallization in solid-state thin films could have broad applications toward the realization of high efficiency photovoltaic devices.

18 Claims, 9 Drawing Sheets

LOW TEMPERATURE FORMATION OF PEROVSKITE FILMS IN SUPERCRITICAL FLUIDS

FIELD OF THE INVENTION

The invention is generally related to a rapid production of perovskite films at low annealing temperature. These perovskite films have particular utility in solar cell applications.

BACKGROUND OF THE INVENTION

Photovoltaic solar cells are a leading technology for clean, renewable energy, but fabrication costs must be reduced and efficiencies improved in order to compete with and replace non-renewable sources of energy[1][2]. To date, relatively high efficiencies have been reported in thin film solar cells such as CdTe, GaAs, CuInGaSe$_2$ (CIGS), organic solar cells, dye sensitized solar cells[3] and others such as graphene, carbon nanotube[4] and quantum dot solar cells [5]. Yet none of these technologies integrates low cost and simple processing with high efficiencies.

Organic-inorganic hybrid perovskite solar cells offer the prospect of excellent power conversion efficiency (PCE) and low-cost solution-based processing, making the technology a leading candidate for cost effective renewable energy. Perovskite refers to the ABX$_3$ structure (usually A: CH$_3$NH$_3$ (MA) or NH$_2$CHNH$_2$ (FA); B: Pb, Ge, or Sn; X: 1, Br, CI, or mixed halides) with the most popular being methylammonium lead triiodide (CH$_3$NH$_3$PbI$_3$ or MAPbI$_3$) having PCE from 3.8% in 2009[6] to a recorded 23.2% in 2018[7]. The best monolithically integrated perovskite-silicon tandems have reached an efficiency of 26%[8]. Recently, Oxford PV announced a certified perovskite/silicon tandem solar cell with PCE of 28%[9]. In addition, perovskite exhibits a high absorption coefficient[10], small exciton binding energy[11], high carrier mobility[12], large carrier diffusion length[13], bandgap tenability[14] and high tolerance for defects[15] thus making them an optoelectronic material uniquely suited for use in photovoltaic devices.

Thus far, several solution and vapor deposition techniques have been developed to prepare high-quality perovskite films[16]. These include spin coating, soft cover deposition, inkjet printing, slot-die coating, doctor-blade coating, brush painting, drop casting, pneumatic spray coating, ultrasonic coating and electrospray[17]. Perovskite films are deposited from a precursor solution followed by thermal annealing [18][19] through conduction (hotplate) or convection (oven), typically in the presence of vapor, to induce solid-state crystallization.

Annealing (typically at temperatures above 100° C.) can introduce impurities such as PbI$_2$ and reduce device performance[20]. Alternate post treatment approaches have been investigated including solvent annealing[21][22], microwave treatment[23], ultrasonic vibration[24][25] and hot-pressing[26] but have resulted in poor film quality and longer crystallization times.

CO$_2$ when pressurized and heated above its critical point is a single-phase supercritical fluid with tunable liquid-like density[27]. The primary advantage of the supercritical fluid for use in solid-state film crystallization is that it has no surface tension and during removal of the scCO$_2$ by depressurization, it enters the gas phase without crossing a phase boundary, thus eliminating detrimental solvent residue effects, which make liquid solvents problematic. CO$_2$ is also non-toxic, inexpensive, abundant, non-flammable, and recyclable with high permeability enabling faster mass transfer rates to penetrate highly permeable nanostructures and thin films[28]. CO$_2$ is the most popular supercritical fluid due to its moderate critical temperature and pressure and can act as a solvent, anti-solvent, solute and reaction medium for materials processing. It is a non-polar solvent with large quadrupole moment and a polar C=O bond which makes some materials soluble [29].

Supercritical CO$_2$ (scCO$_2$) has been investigated in research and employed in industry since 1950 for various processes such as the decaffeination of coffee, extraction of hops[30], processing of 3D aerogels[31], exfoliation and intercalation of layered materials[32][33], processing of coatings[34][35] and in crystallization of nanostructure materials, thin films and polymers[36][37]. Wei et al demonstrated high surface area and high electronic properties of dye-sensitized solar cell using supercritical fluid to process the mesoporous crystalline TiO$_2$[38].

SUMMARY OF THE INVENTION

Herein we detail results on the use of supercritical fluids (e.g., supercritical CO$_2$, etc.) to crystallize perovskite films at low temperature (e.g., room temperature (23° C.) to 50° C.). Other features and advantages of the present invention will be set forth in the description of the invention that follows, and in part will be apparent from the description or may be learned by practice of the invention.

In some aspects, methods are provided for rapid production of high-quality perovskite films of formula AMX$_3$, wherein the A is typically an organic cationic ammonium compound but can also be inorganic, M is at least one divalent metal and X is a halide F, Cl, Br or I. The exemplary disclosed processes reduce the time and the cost of the production of the perovskite films compared to prior processes.

In addition, the processes described herein allows for adjustment of the average grain size, film morphology, and absorption spectra. This enables manufacturers to fine tune or enhance the morphology, crystal structure, optical and electrical properties of a wide range of the thin films. The perovskites films of this invention are useful in the production of photovoltaic devices.

In some aspects, a method to produce perovskite films of formula AMX$_3$ include, first depositing perovskite precursors (the chemical constituents from which the perovskite is formed) onto a substrate using any number of methods such as spin-casting or spray-deposition. The substrate could consist of any solid surface that can support to perovskite precursors. In solar cells, the substrate is typically a glass slide containing other layers such as titanium dioxide onto which the perovskite film is deposited to create the solar cell device. The perovskite precursors are then crystallized into perovskite by placing the coated substrate into a pressure vessel and pressurizing the vessel with, for example, either pure supercritical CO$_2$ or supercritical CO$_2$ with another cosolvent forming a binary supercritical solution. Because the supercritical solution is an antisolvent to the perovskite, the film is not dissolved by the supercritical fluid, but the supercritical fluid facilitates the molecular rearrangement of the precursor molecules into perovskite. Because the critical point of CO$_2$ is low (31° C.), the crystallization process in supercritical CO$_2$ can be performed at much lower temperatures than is required when using temperature alone (annealing) to perform this crystallization step.

In another aspect, the crystallization step is conducted in a binary supercritical solution containing CO$_2$ combined with an organic co-solvent at concentration in the range of 0.1 to 2.0%, such as 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0. The co-solvent modifies the solution polarity and strength of interaction with the perovskite precursors and can be used to modify the resulting perovskite morphology.

These and other aspects, features, and advantages will be more fully apparent from the following detailed description of illustrated embodiments, the accompanying drawings, and associated claims.

BRIEF DESCRIPTION OF THE DRAWINGS

The aforementioned and other aspects, features, and advantages of the present disclosures will be better understood by reference to the following detailed description when considered in connection with the accompanying drawings, and associated claims.

DETAILED DESCRIPTION

The present disclosure provides methods of making perovskites films, and products made from the perovskite films.

In one aspect, the invention is directed to methods for producing a crystalline film having a halide perovskite composition. The term "crystalline", as used herein, generally refers to a polycrystalline structure, although a single-crystal structure may also be employed. As well known in the art, a polycrystalline material possesses crystal grains, which can be characterized as having an average grain size. Particularly in the case of photovoltaic and other photoactive materials, a larger grain size is desirable since it generally provides improved photoelectric or photocatalytic properties. In different embodiments, the process described herein produces a perovskite film having an average grain size of about, at least, or above 200 nm to 1000 nm, such as 200, 250, 300, 350, 400, 450, 500, 550, 600, 650, 700, 750, 800, 850, 900, 950 or 1000 nm or an average grain size within a range bounded by any two of the foregoing exemplary values. The term "about," as used herein, generally indicates a deviation of no more than 10%, 5%, or 1% from a given value. Thus, the term "about 200 nm" may indicate, within its broadest interpretation, a value in the range of 190-210 nm.

The crystalline film described herein has a halide perovskite composition according to the following formula: $AMX_3$, wherein A is typically an organic cationic organic compound selected from the group consisting of methylammonium ($CH_3NH_3^+$), tetramethylammonium (($CH_3)_4N^+$), formamidinium ($H_2N=CH-NH_2^+$), and guanidinium ($H_2N=C-(NH_2)_2^+$) organic cations. In some embodiments, the cation could consist of an inorganic cation such as but not limited to $N^+$, $K^+$ or $Cs^+$. The variable M is at least a divalent. The divalent metal (M) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium). The variable X is a halide selected from the group consisting of fluoride ($F^-$), chloride ($Cl^-$), bromide ($Br^-$), or iodide ($I^-$).

In some embodiments, the perovskite films have the formula: $CH_3NH_3PbX_3$, wherein X is a halide selected from the group consisting of fluorine ($F^-$), chlorine ($Cl^-$), bromine ($Br^-$) and iodine ($I^-$).

In further embodiment, the perovskite films have the formula: $CH_3NH_3PbI_3$.

In some aspects the process disclosed herein to produce the perovskite films include i) depositing inorganic-organic or all inorganic precursors unto a substrate, where said depositing step produces a film of a perovskite precursor solution, ii) exposing the film of the perovskite precursors to a supercritical fluid at a temperature of less than or equal to 50° C. (e.g., 25° C., 30° C., 35° C., 40° C., 45° C., 50° C.), and iii) inducing crystallization of perovskites precursor solution so as to produce a film with perovskite crystals.

In some embodiments, the perovskite precursors are crystallized on the substrate in the presence of $scCO_2$. The $scCO_2$ does not dissolve the perovskite precursors, but acts as a mobilizer to significantly enhance the film crystallization rate. Virtually any kind of substrate may be used (e.g., glass, ceramic, metal, plastic, etc.). In addition, other supercritical fluids may be used (e.g., methane, ethylene, propane, propylene, etc.). For example, the perovskite precursors would be crystallized on the substrate in the presence of scmethane, scethylene, scpropane, or scpropylene.

In another embodiment, the crystallization step is performed in the presence of a supercritical fluid (e.g., $scCO_2$) at a low temperature such as a temperature less than or equal to 50° C. In the presence of $scCO_2$ high quality perovskite film could be produced rapidly and with annealing temperature lower than 50° C. Without the $scCO_2$, much high annealing temperature, such as greater than 80° C. and longer annealing time is required to produce high quality films.

$CO_2$ when pressurized and heated above its critical point is a single-phase supercritical fluid with tunable liquid-like density[27]. The primary advantage of the supercritical fluid for use in solid-state film crystallization is that it has no surface tension and during removal of the $scCO_2$ by depressurization, it enters the gas phase without crossing a phase boundary, thus eliminating detrimental solvent residue effects, which make liquid solvents problematic. $CO_2$ is also non-toxic, inexpensive, abundant, non-flammable, and recyclable with high permeability enabling faster mass transfer rates to penetrate highly permeable nanostructures and thin films[28]. $CO_2$ is the most popular supercritical fluid due to its moderate critical temperature and pressure and can act as a solvent, anti-solvent, solute and reaction medium for materials processing. It is a non-polar solvent with large quadrupole moment and a polar C=O bond which makes some materials soluble [29]. Supercritical methane, ethylene, propane, and propylene have similar properties.

The term anti-solvent is typically used in solution crystallization to refer to a second solvent, which when added to the first solvent reduces the solubility of the solute. Herein, anti-solvent refers a solvent in which the product is insoluble. The $scCO_2$ anti-solvent does not dissolve the perovskite precursors but accelerates the solid-state reaction kinetics to enhance crystallization. This process enables complete perovskite conversion with an average crystal grain size of 408 nm at 45° C. with $scCO_2$ treatment compared to incomplete crystal formation with average grain size of 175 nm at 45° C. with thermal annealing alone. Additional grain growth was observed with an increase in $scCO_2$ treatment time and temperature. The $scCO_2$ post-treatment process disclosed herein, will be useful for large-scale production of high quality perovskite layers.

In some embodiment, the post treatment crystallization of perovskite films using supercritical $CO_2$, increases the crystallinity and average grain size of $CH_3NH_3PbI_3$ films. In this case $scCO_2$ acts as an anti-solvent for perovskite films.

In some embodiment, the crystallization step is conducted in a supercritical fluid (e.g., supercritical $CO_2$) combined with a co-solvent. The co-solvent is chosen from a group of organic solvent consisting of benzene, toluene, dichloromethane, hexane, xylene, tetrahydrofuran, acetone, dimethyl sulfoxide, dimethylformamide, ethanol, isopropanol, methanol or ethylene glycol. The v/v % concentration of the co-solvent is in the range 0.1 to 2.0% such as, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9 or 2.0%. The use of the co-solvent in conjunction with the $scCO_2$ enhances the overall molecular transport within the film. The co-solvent can preferentially interact with specific film components to selectively mobilize or extract one component within a solid film. This affords the advantage to selectively adjust the average grain size, the film morphology and the absorption spectra. Therefore, the use of a combination of the $scCO_2$ and a co-solvent in the production process of perovskite films allows to enhance or fine tune the morphology, crystal structure, optical and electrical properties of a wide range of thin films depending on the hydrogen-bonding properties of the solvent.

Effect of Poorly Hydrogen-Bonded Co-Solvents Such as Toluene and Benzene

Figure 1:
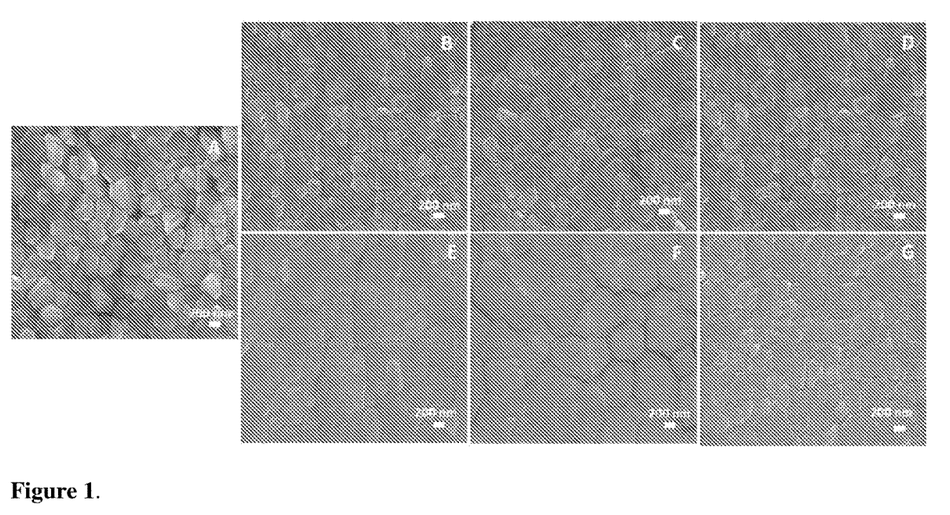
FIG. 1: SEM images (panels A-G) of the top surfaces of the perovskite film processed in pure $scCO_2$ and different (V/V %) of toluene as a co-solvent; A—Pure $scCO_2$, B—$scCO_2$+0.2% (V/V) toluene, C—$scCO_2$+0.4% (V/V) toluene, D—$scCO_2$+0.8% (V/V) toluene, E—$scCO_2$+1.2% (V/V) toluene, F—$scCO_2$+1.6% (V/V) toluene, and G—$scCO_2$+2.0% (V/V) toluene.
Figure 2:
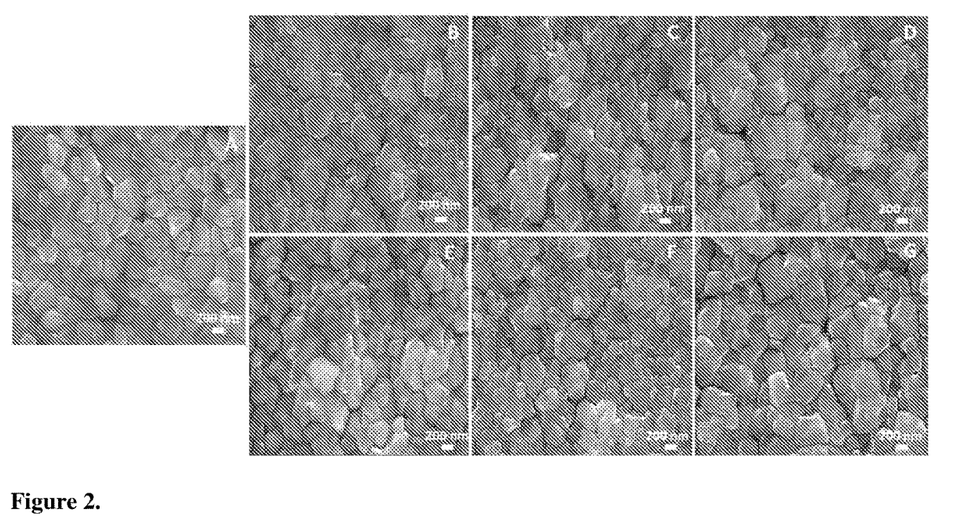
FIG. 2: SEM images (panels A-G) of the top surfaces of the perovskite film processed in pure $scCO_2$ and different (V/V %) of benzene as a co-solvent; A—Pure $scCO_2$, B—$scCO_2$+0.2% (V/V) benzene, C—$scCO_2$+0.4% (V/V) benzene, D—$scCO_2$+0.8% (V/V) benzene, E—$scCO_2$+1.2% (V/V) benzene, F—$scCO_2$+1.6% (V/V) benzene, and G—$scCO_2$+2.0% (V/V) benzene.
Figure 3A:
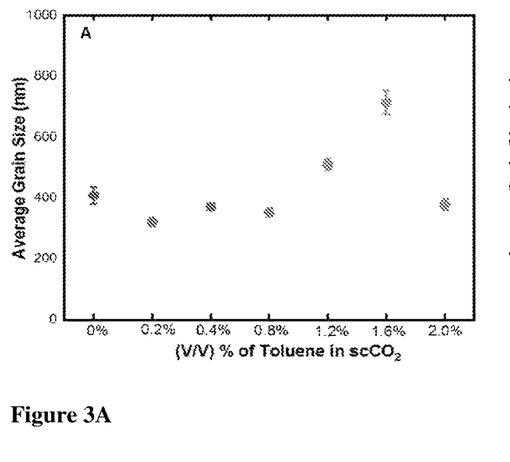
FIGS. 3A and 3B: Graphs showing average grain size of $CH_3NH_3PbI_3$ after treatment with pure $scCO_2$ and different (V/V %) of toluene (FIG. 3A) and benzene (FIG. 3B).
Figure 3B:
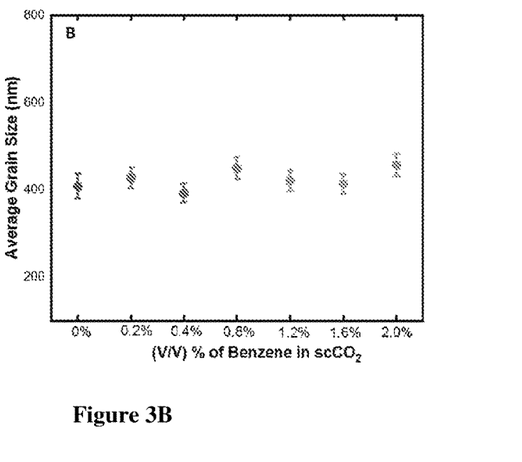

Scanning Electron Microscope (SEM) measurements were performed to characterize the $CH_3NH_3PbI_3$ film surface morphology after annealing in $scCO_2$+Toluene at different volume ratios. FIG. 1A shows the morphology of a film annealed in pure $scCO_2$ without any co-solvent and resulted in uniform and high-quality films as reported previously [27]. FIG. 1B-G shows the morphology of films annealed in $scCO_2$ with the toluene co-solvent at various volume fractions. The addition of toluene, which does not dissolve either $PbI_2$ or $CH_3NH_3I$, produces measurable changes to the resulting film morphology and average grain size. FIG. 2 presents SEM images of the $CH_3NH_3PbI_3$ films after annealing with $scCO_2$ (A) and $scCO_2$+Benzene (B-G). The addition of different percent volume/volume ratio of benzene resulted in more subtle morphology changes as shown in FIG. 2B-G.

The grain size distribution of the films annealed in pure $scCO_2$ and $scCO_2$+Toluene and Benzene were obtained and are shown in FIGS. 2A and B. The average grain size for pure $scCO_2$ was about 400 nm. The average grain size of films annealed in scCO$_2$+Toluene from 0.2-0.8 (V/V %) is comparable to that of pure scCO$_2$. However, the average grain size increases dramatically from around 400 nm to about 750 nm at 1.6 (V/V %) and quickly drops down to about 400 nm at 2.0 (V/V %).

Figure 4A:
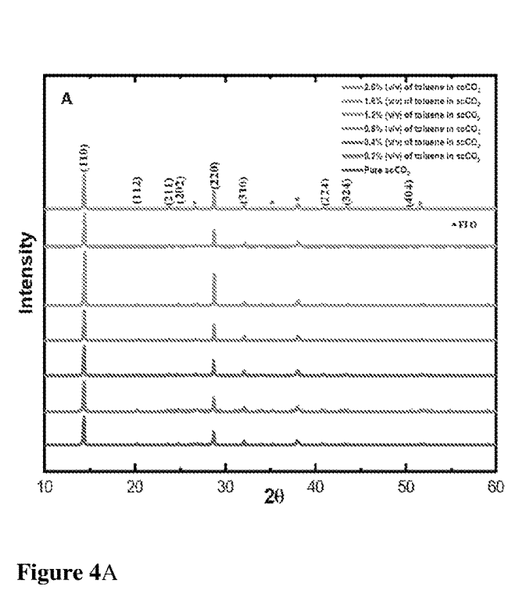
FIG. 4A Xray diffraction (XRD) patterns of the perovskite thin film with pure $scCO_2$ and different (V/V) % of toluene.
Figure 5A:
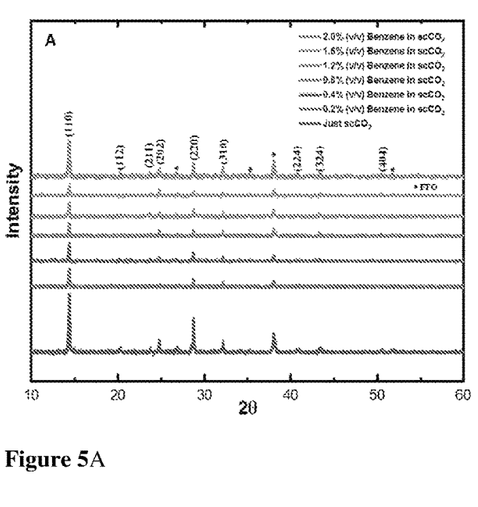
FIG. 5A XRD patterns of the perovskite thin film with pure $scCO_2$ and different (V/V) % of benzene.

The effect of the co-solvents on the film crystallinity was studied using XRD. FIGS. 4A and 5A shows that the relative intensity of the diffraction peaks from the different planes did not change, implying that the crystal orientation of the scCO$_2$+Toluene and scCO$_2$+Benzene annealed films did not change during annealing. Complete crystallization was observed for all samples with no visible PbI$_2$ peak. The diffraction peaks at 14.4°, 24.8°, 28.7°, and 32.2°, correspond to the (110), (202), (220), and (310) planes of crystalline CH$_3$NH$_3$PbI$_3$, respectively with a tetragonal crystal structure [21] [45] [46] [47].

Figure 4B:
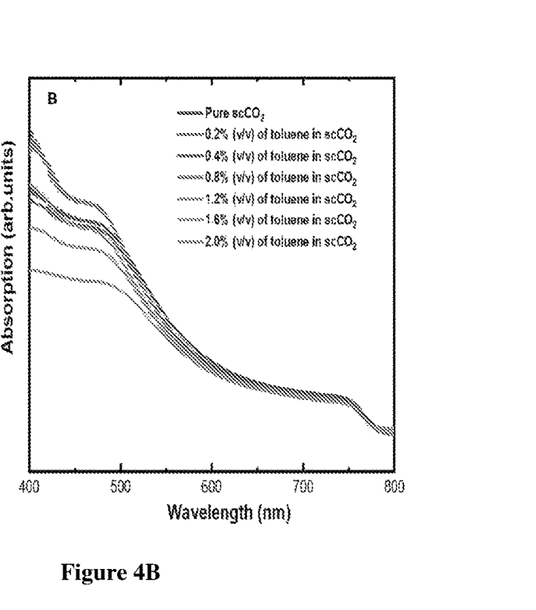
FIG. 4B optical absorption spectra of the thin film at different treatment conditions.
Figure 5B:
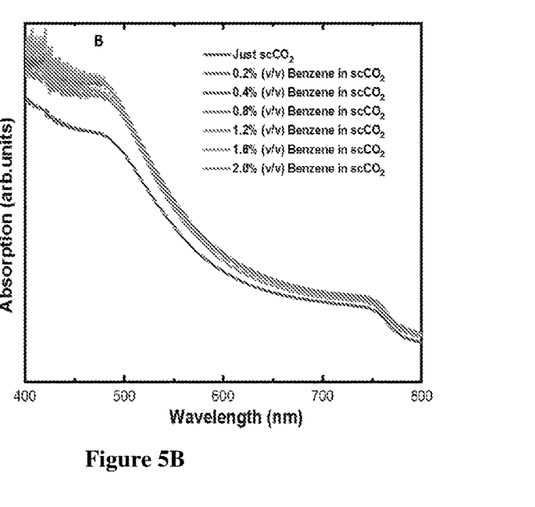
FIG. 5B optical absorption spectra of the thin film at different treatment conditions.

FIGS. 4B and 5B presents the optical absorption spectra for the toluene and benzene co-solvents respectively in comparison to pure scCO$_2$. The overall shape of the absorption spectra for both co-solvents was similar to pure CO$_2$. All of the films treated with the benzene co-solvent exhibited stronger optical absorption at all wavelengths in comparison to pure scCO$_2$, which usually indicates better film quality. However, the absorption spectra of the films treated in the toluene co-solvent exhibited a strong and somewhat random deviation from the pure scCO$_2$ film, particularly at the shorter wavelengths. Surprisingly, the 1.6% (v/v) toluene film with the largest grain size exhibited lower optical absorption than pure scCO$_2$ at shorter wavelengths.

Figure 6:
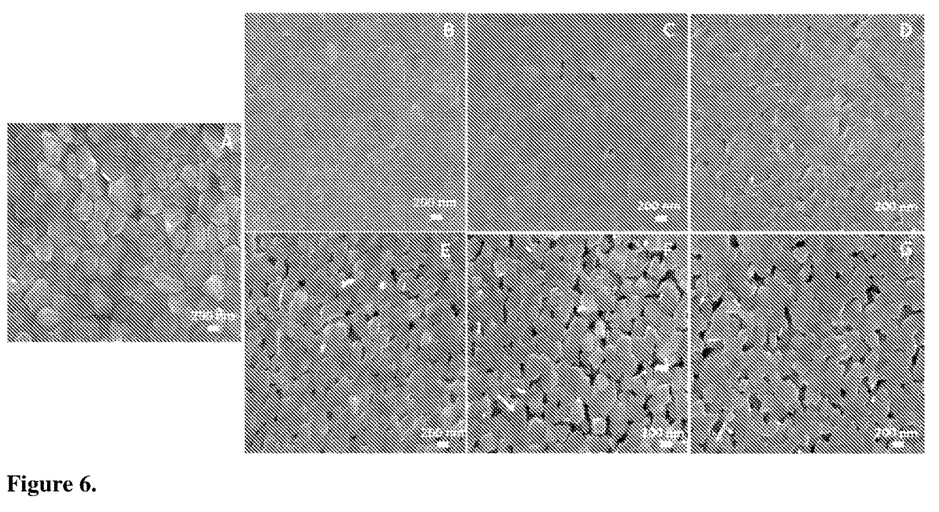
FIG. 6: SEM images (panels A-G) of the top surfaces of the perovskite film processed in pure $scCO_2$ and different (V/V %) of tetrahydrofuran as a co-solvent; A—Pure $scCO_2$, B—$scCO_2$+0.2% (V/V) tetrahydrofuran, C—$scCO_2$+0.4% (V/V) tetrahydrofuran, D—$scCO_2$+0.8% (V/V) tetrahydrofuran, E—$scCO_2$+1.2% (V/V) tetrahydrofuran, F—$scCO_2$+1.6% (V/V) tetrahydrofuran, and G—$scCO_2$+2.0% (V/V) tetrahydrofuran.
Figure 7:
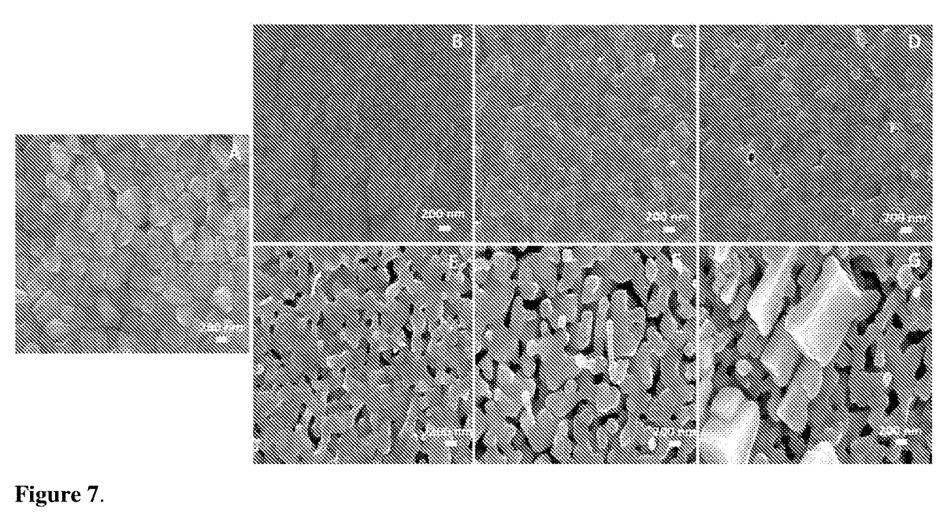
FIG. 7: SEM images (panels A-G) of the top surfaces of the perovskite film processed in pure $scCO_2$ and different (V/V %) of acetone as a co-solvent; A—Pure $scCO_2$, B—$scCO_2$+0.2% (V/V) acetone, C—$scCO_2$+0.4% (V/V) acetone, D—$scCO_2$+0.8% (V/V) acetone, E—$scCO_2$+1.2% (V/V) acetone, F—$scCO_2$+1.6% (V/V acetone, and G—$scCO_2$+2.0% (V/V) acetone.
Figure 8A:
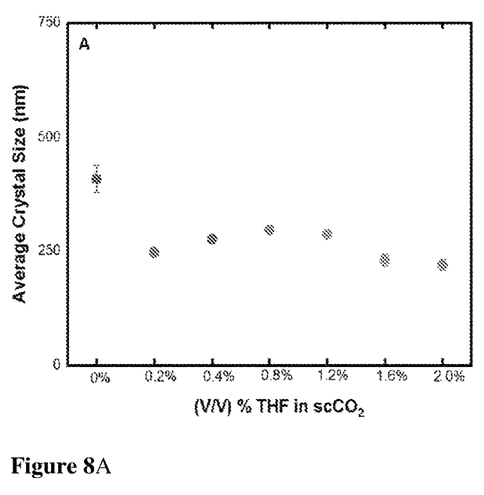
FIGS. 8A and 8B Graphs showing the average grain size of $CH_3NH_3PbI_3$ after treatment with pure $scCO_2$ and different (V/V %) of tetrahydrofuran (FIG. 8A) and acetone (FIG. 8B).
Figure 8B:
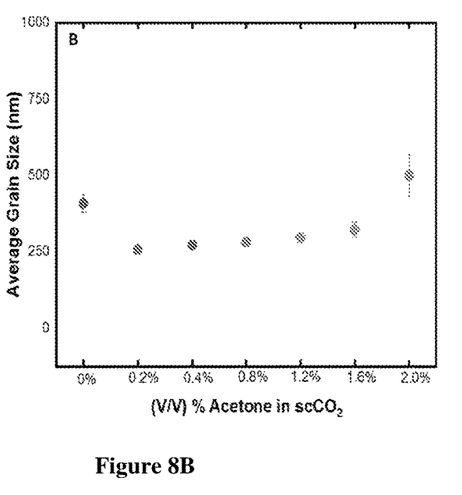

Effect of Moderately Hydrogen-Bonded Co-Solvents Such as Tetrahydrofuran and Acetone FIGS. 6 and 7 presents SEM images of the top surfaces of the perovskite films after annealing in scCO$_2$+THF and scCO$_2$+Acetone. It has been reported that as the concentration of PbI$_2$ in the perovskite film is reduced, the quality of the morphology is compromised leading to a porous film [48]. From FIGS. 6A and 7A we see a smooth and compact morphology with annealing in pure scCO$_2$. However, with the addition of THF and acetone FIG. 6B-G and FIG. 7B-G, the morphology of the film is dramatically altered, with an increasing number of pinhole defects correlated with an increase in the percent volume of the co-solvent. This is most likely due to the selective interaction of these co-solvents with PbI$_2$. The THF morphology appears to be less defective with increasing co-solvent volume than that of acetone possibly due to the lower solubility parameter of the former resulting in a weaker interaction with PbI$_2$ The grain size distribution of the films were obtained for pure scCO$_2$ and scCO$_2$+THF and acetone as shown in FIGS. 8A and B. With the addition of THF and Acetone, the average crystal size is slightly lower than that of pure scCO$_2$ films. This could be due to a disturbance of the interdiffusion of PbI$_2$ into CH$_3$NH$_3$I because of solubility interactions of the PbI$_2$ with the co-solvents. The film annealed in 2% (v/v) acetone showed a larger average grain size, but inspection of the SEM image of that film (FIG. 7G) shows the emergence of very large grains that appear to be crystalline, but the overall film quality is poor.

Figure 9A:
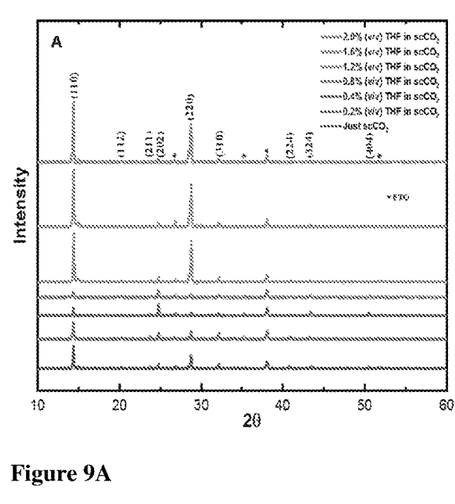
FIG. 9A: XRD patterns of the perovskite thin film with pure $scCO_2$ and different (V/V) % of tetrahydrofuran.
Figure 10A:
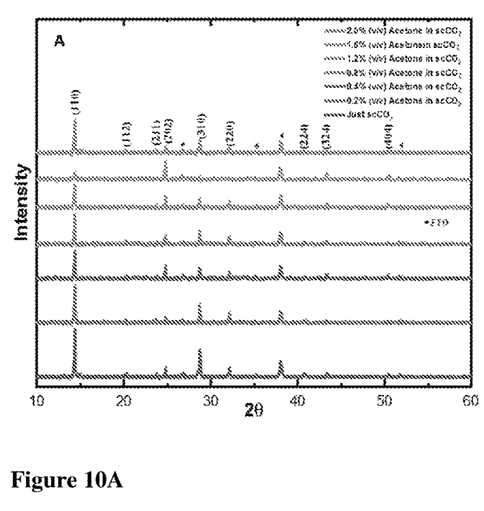
FIG. 10A XRD patterns of the perovskite thin film with pure $scCO_2$ and different (V/V) % of acetone.

The effect of the co-solvents on the film crystallinity was studied using XRD. FIGS. 9A and 10A, show that, while all of the films exhibit peaks corresponding to the tetragonal perovskite crystal structure, the relative intensity of the diffraction peaks changed depending on the co-solvent concentration. The THF films processed at co-solvent volume fractions of 0.4% and 0.8% exhibited a stronger (202) peak in comparison to the normally dominant (110) peak. For the films processed in acetone, the (202) peak is enhanced when processing at a co-solvent volume fraction of 1.6%. This implies that the preferred crystallographic orientation of the scCO$_2$+THF and scCO$_2$+acetone processed films can be influenced by the co-solvent volume fraction. The preferred reorientation in the perovskite film could be related to the nucleation dynamics and lattice distortion during crystal formation [49][50][51]. But the unsystematic reorientation to the (202) plane at specific co-solvent volume fractions is not understood at this time.

Figure 9B:
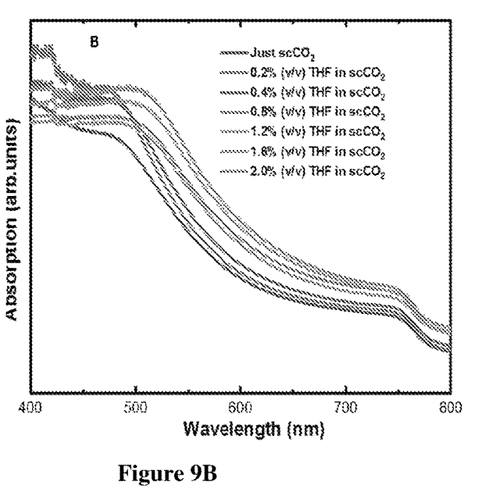
FIG. 9B Optical absorption spectra of the thin film at different treatment conditions.
Figure 10B:
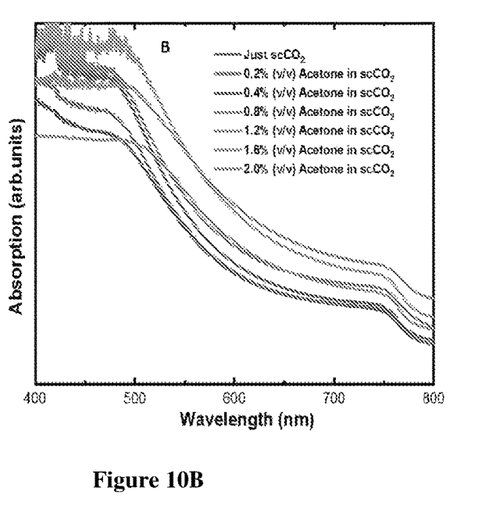
FIG. 10B Optical absorption spectra of the thin film at different treatment conditions.

FIGS. 9B and 10B presents the evolution of the optical absorption spectra. From this, we notice a similar overall shape of the scCO$_2$+THF and scCO$_2$+acetone annealed films to that of pure scCO$_2$. In FIG. 9B, for THF concentrations above 0.4% a noticeable red shift in the short wavelength shoulder of the absorption spectra is seen. For pure scCO$_2$, the shoulder in the absorption spectra is at approximately 475 nm, but increases to about 510 nm when processed in THF at concentrations above 0.4%. From the SEM images of FIG. 6, it can be seen that the films processed at higher THF concentrations (FIG. 6E,F,G) have a distinctly different morphology than that of the films processed in pure CO$_2$. While the bandgap shoulder at around 780 nm is the same for all films, the shoulder in the absorption spectra near 500 nm is due to changes in higher energy interband transitions. The ability to use post processing in supercritical fluids to shift the absorption spectra in perovskite films could be useful in photovoltaic devices. Although the film morphology was not smooth with increasing volume percent of co-solvents, the absorption increased relative to that of pure scCO$_2$. This may also be attributed to scattering which is not accounted for.

Effect of Strongly Hydrogen-Bonded Co-Solvents Such as Ethanol, Methanol and Ethylene Glycol.

Figure 11:
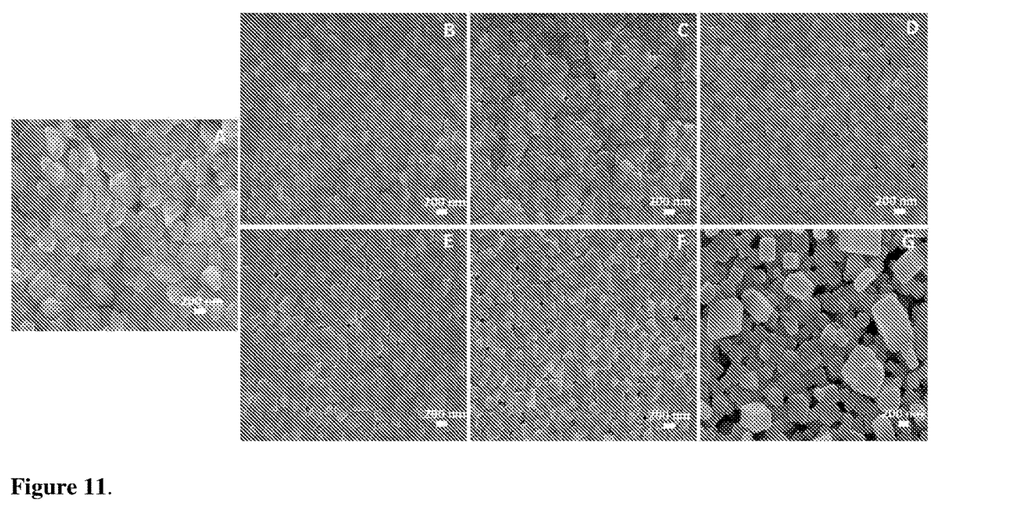
FIG. 11: SEM images (panels A-G) of the top surfaces of the perovskite film processed in pure $scCO_2$ and different (V/V %) of ethanol as a co-solvent; A—Pure $scCO_2$, B—$scCO_2$+0.2% (V/V) ethanol, C—$scCO_2$+0.4% (V/V) ethanol, D—$scCO_2$+0.8% (V/V) ethanol, E—$scCO_2$+1.2% (V/V) ethanol, F—$scCO_2$+1.6% (V/V ethanol, and G—$scCO_2$+2.0% (V/V) ethanol.
Figure 12:
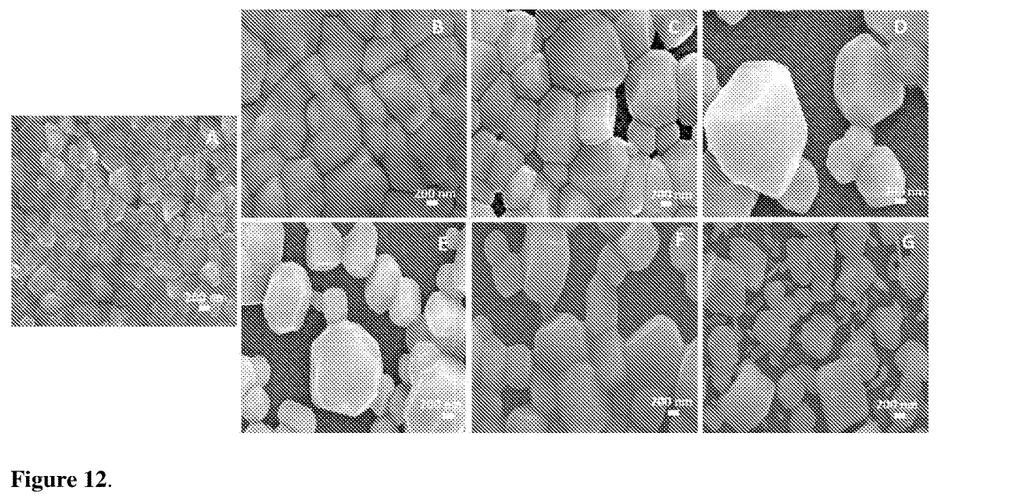
FIG. 12: SEM images (panels A-G) of the top surfaces of the perovskite film processed in pure $scCO_2$ and different (V/V %) of methanol as a co-solvent; A—Pure $scCO_2$, B—$scCO_2$+0.2% (V/V) methanol, C—$scCO_2$+0.4% (V/V) methanol, D—$scCO_2$+0.8% (V/V) methanol, E—$scCO_2$+1.2% (V/V) methanol, F—$scCO_2$+1.6% (V/V methanol, and G—$scCO_2$+2.0% (V/V) ethanol.
Figure 13:
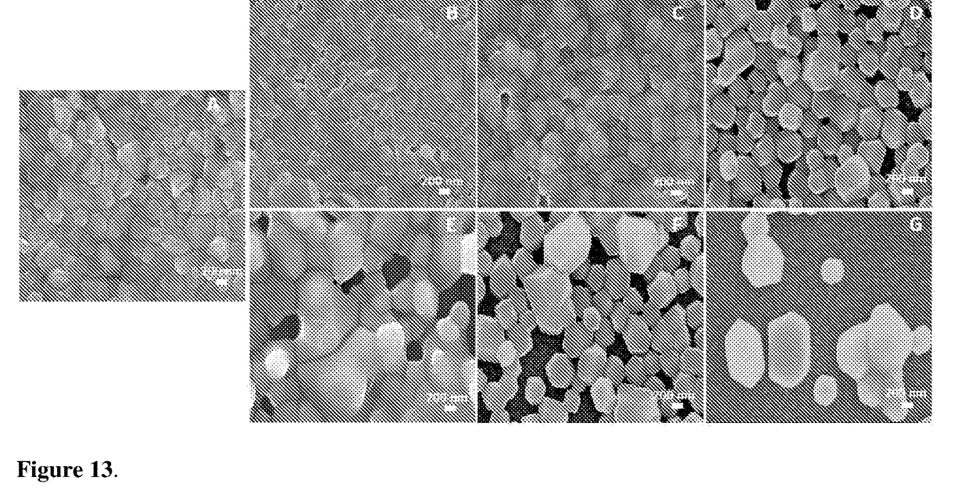
FIG. 13: SEM images (panels A-G) of the top surfaces of the perovskite film processed in pure $scCO_2$ and different (V/V %) of ethylene glycol as a co-solvent; A—Pure $scCO_2$, B—$scCO_2$+0.2% (V/V) ethylene glycol, C—$scCO_2$+0.4% (V/V) ethylene glycol, D—$scCO_2$+0.8% (V/V) ethylene glycol, E—$scCO_2$+1.2% (V/V) ethylene glycol, F—$scCO_2$+1.6% (V/V ethylene glycol, and G—$scCO_2$+2.0% (V/V) ethylene glycol.

FIGS. 11, 12 and 13 presents SEM images of the top surfaces of the perovskite thin films after annealing with scCO$_2$+ethanol, scCO$_2$+methanol and scCO$_2$+ethylene glycol respectively. The CH$_3$NH$_3$I precursor is soluble in each of these co-solvents and it has been shown that as the concentration of CH$_3$NH$_3$I is reduced, CH$_3$NH$_3$PbI$_3$ cuboids begin to form [52]. The size of the cuboids increases with decreasing concentration of CH$_3$NH$_3$I with average dimension exceeding 1 µm. From FIGS. 11A, 12A and 13A we see a smooth and compact morphology with annealing in pure scCO$_2$. However, with the addition of ethanol (FIG. 11B-G), methanol (FIG. 12B-G) and ethylene glycol (FIG. 13B-G), we see diverse and noticeable changes in film morphology, ranging from smooth, compact and homogeneous grains to cuboids, hexagonal grains and large shapeless grains due to the strong hydrogen bonding interaction.

The formation of the cuboids (FIGS. 11G and 12G) is likely due to the selective interactions of these co-solvents with CH$_3$NH$_3$I since it is soluble in them. PbI$_2$ is not soluble in ethanol and methanol and this could account for the smoothness of these films at low volume percent. However, as the volume percent increases, large micron-size rounded or cubic shapes emerge. Ethylene glycol is a weak solvent for PbI$_2$ and a solvent for CH$_3$NH$_3$I leading to a combined effect with solubility interactions with both precursors. It can be noted that as the solubility parameter of these strongly hydrogen bonded solvents increases (ethanol to methanol to ethylene glycol) the interactions with the film constituents increases leading to more dramatic changes in film morphology.

Figure 14A:
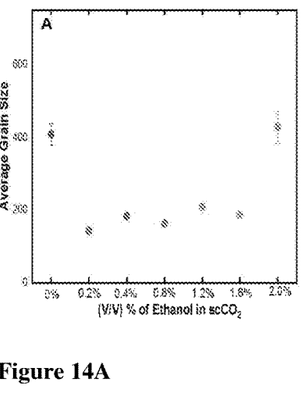
FIG. 14A-C: Graphs showing the average grain size of $CH_3NH_3PbI_3$ after treatment with pure $scCO_2$ and different (V/V %) of ethanol (FIG. 14A), methanol (FIG. 14B), and ethylene glycol (FIG. 14C).
Figure 14B:
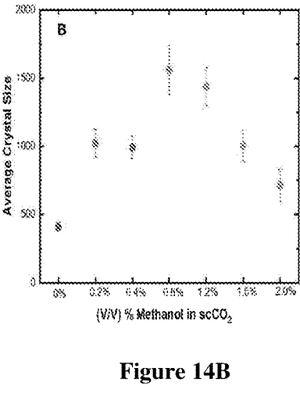
Figure 14C:
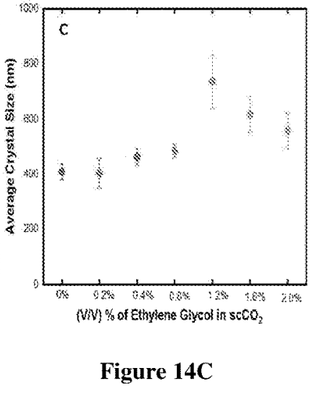

The grain size distribution of the films were obtained for pure scCO$_2$ processing and scCO$_2$+ethanol, scCO$_2$+methanol and scCO$_2$+ethylene glycol as shown in FIGS. 14A, B and C. With the addition of ethanol, the average crystal size is slightly lower than that of pure scCO$_2$ films and jumps back up when the cuboids begin to form. When methanol and ethylene glycol are added, the average grain size increases but becomes highly non-uniform and riddled with defects.

Figure 15A:
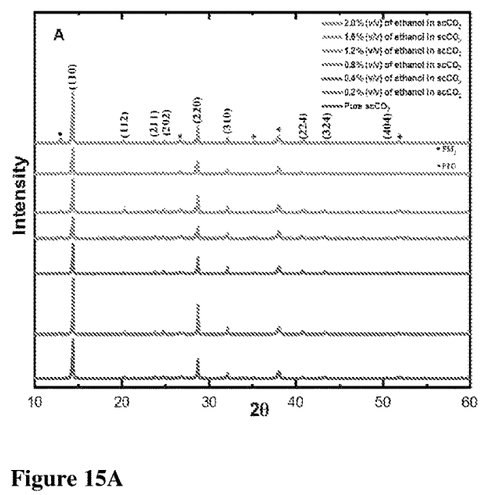
FIG. 15A: XRD patterns of the perovskite thin film with pure $scCO_2$ and different (V/V) % of ethanol.
Figure 16A:
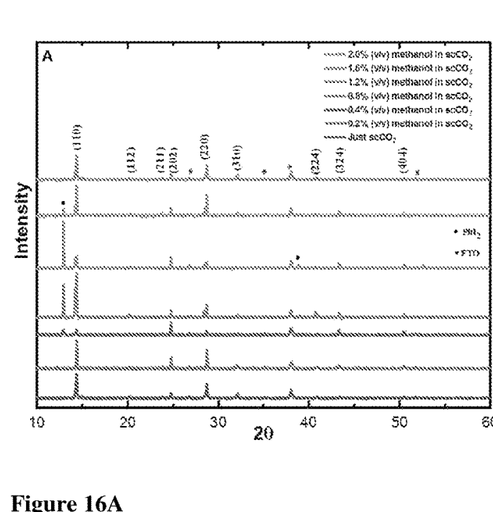
FIG. 16A: XRD patterns of the perovskite thin film with pure $scCO_2$ and different (V/V) % of methanol.
Figure 17A:
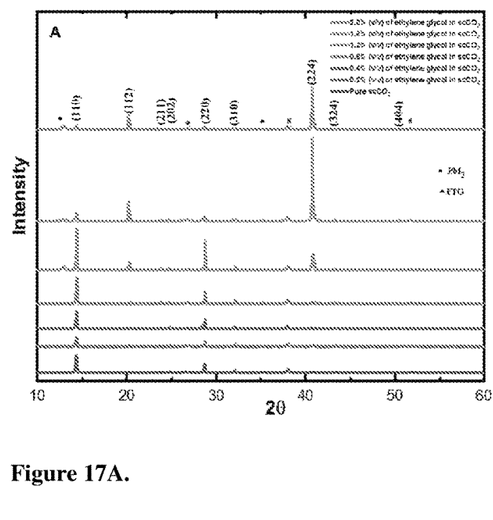
FIG. 17A: XRD patterns of the perovskite thin film with pure $scCO_2$ and different (V/V) % of ethylene glycol.

FIGS. 15A, 16A and 17A, shows that the relative intensity of the X-ray diffraction peaks of scCO$_2$+ethanol, scCO$_2$+methanol and scCO$_2$+ethylene annealed films respectively. With ethanol, we notice that the overall crystal structure is not compromised until at 2% (V/V) the peak associated with PbI$_2$ becomes visible. With methanol, all of samples present the same diffraction peaks corresponding to planes of crystalline CH$_3$NH$_3$PbI$_3$. Two significant peaks located at 12.6° and 38.2° corresponding to the diffraction from (001) and (110) lattice planes of PbI$_2$ hexagonal polytype, respectively appear [53]. It has been indicated that residual PbI$_2$ can bring about a passivation effect in PSCs to improve photovoltaic performance [54]. Nevertheless, in general excess of PbI$_2$ has a negative impact and impedes carrier transport. With ethylene glycol, tetragonal crystal structure is seen up to 0.8% (V/V) ratio in scCO$_2$. Once the volume of ethylene glycol exceeds this point, we notice that the dominant peak shifts from (110) to the (224) plane possibly due to CH$_3$NH$_3$I assisted reorientation of PbI$_2$ peak of (001) [55]

Figure 15B:
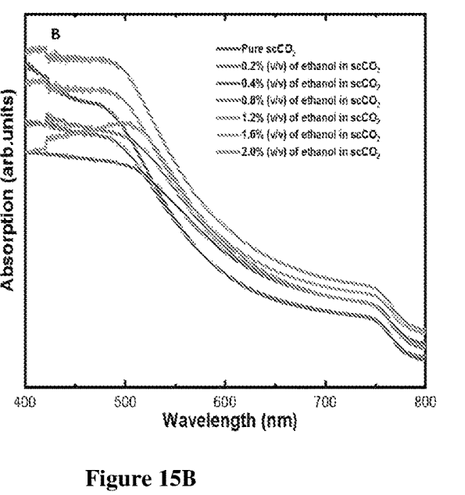
FIG. 15B Optical absorption spectra of the thin film at different treatment conditions.
Figure 16B:
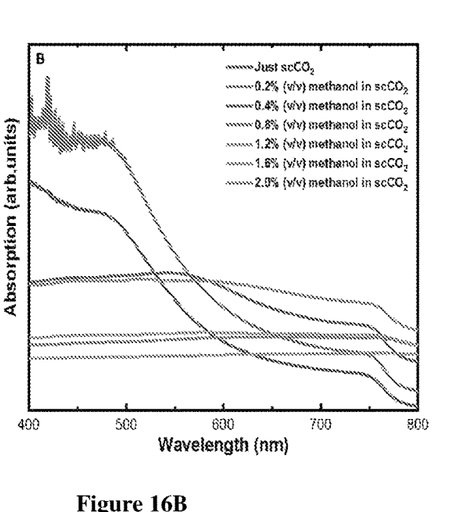
FIG. 16B Optical absorption spectra of the thin film at different treatment conditions.
Figure 17B:
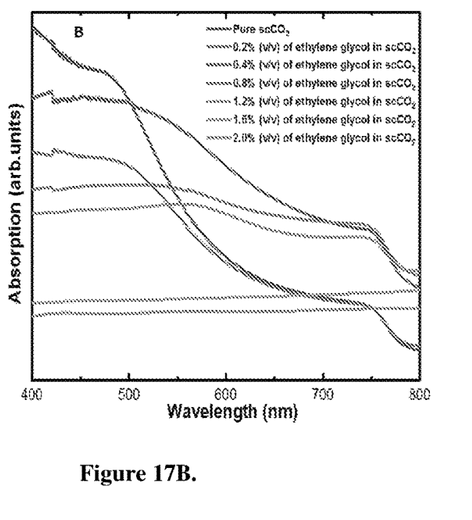
FIG. 17B Optical absorption spectra of the thin film at different treatment conditions.

FIGS. 15B, 16B and 17B presents the evolution of the optical absorption spectra of scCO$_2$+ethanol, scCO$_2$+methanol and scCO$_2$+ethylene glycol processed films respectively. The overall shape of the optical absorption spectra for the ethanol co-solvent is similar to that of pure scCO$_2$ but does not follow a trend with increasing or decreasing co-solvent volume percent. Interestingly, for the films processed in both the methanol and ethylene glycol co-solvents, the films become optically transparent above a certain co-solvent volume percent. The XRD patterns for these films still show the perovskite crystal structure, but the absorption spectra show optical transparency at all wavelengths and no discernible band edge.

EXAMPLES

Example 1: Materials and Precursor Preparation

Bone Dry 3.0 Grade Carbon Dioxide with siphon was purchased from Airgas. Precursor solution CH$_3$NH$_3$PbI$_3$ was synthesized by mixing a 1:1:1 molar ratio of 2.385 g of methyl ammonium iodide (CH$_3$NH$_3$I), 6.915 g of lead (II) iodide (PbI$_2$) and 1.063 mL of anhydrous dimethyl sulfoxide (DMSO) in 9.484 mL of anhydrous N,N-dimethylformamide and 0.3 mL of anhydrous diethyl ether. The solution was processed in an argon-filled glovebox, stirred at room temperature for 1 hr and filtered with 0.2 μm syringe filter. Anhydrous Ethylene glycol, methanol, tetrahydrofuran, benzene, ethanol, acetone and toluene were used as co-solvent with scCO$_2$.

Example 2: MAPbI$_3$ Perovskite Thin Film Fabrication

Fluorine doped tin-oxide (FTO) substrates (12-14Ω, 25 mm×25 mm×2.2 mm, Ossila Limited) were cleansed with detergent, de-ionized water, acetone and isopropyl alcohol. The precursor solution was spin coated onto the FTO glass slide at 6000 rpm for 25 sec. During the spin coating procedure, 0.5 mL of diethyl ether was dripped onto the rotating surface for 6 s to remove DMF[43].

The thin film was then placed into a pressure vessel (Parr Instrument Pressure Reactor 4768) and different (V/V %) of co-solvent was added (0.2%, 0.4%, 0.8%, 1.2%, 1.6%, 2.0%). A syringe pump (Teledyne ISCO Pump 260D) was used to pressurize the CO$_2$ and co-solvent for crystallization. This experiment was carried out at 45° C. and 8.27 MPa (1200 psi) and a processing time of 15 minutes for each film. To avoid precipitation of the co-solvents during depressurization, the chamber was exhausted while replenishing with pure CO$_2$ at 8.27 MPa until the co-solvent was sufficiently diluted. Post treatment in pure scCO$_2$ was used as a control for comparison and baseline.

Example 3: Film Characterization

The crystallographic properties of the resulting perovskite films were characterized by X-ray diffraction (XRD) measurements (PANalytical MPD X'pert Pro), using a Cu Kα (λ=1.54 nm) radiation source that operated at 45 kV and 40 mA. The X-ray diffractograms were obtained at a scan rate of 0.01° s$^{-1}$ for 2θ values between 10° and 60°. The surface coverage and grain size were obtained using a scanning electron microscope (SEM) (Hitachi SU-70 FE-SEM) at 20 kV, and analyzed using ImageJ software package. Optical spectrometry (transmission, reflection, absorption) of the films was conducted using a spectral response measurement system (PerkinElmer Lambda 35 UV/VIS Spectrometer)

REFERENCES

[1] A. Miyata, A. Mitioglu, P. Plochocka, O. Portugall, J. T. W. Wang, S. D. Stranks, H. J. Snaith, R. J. Nicholas, Direct measurement of the exciton binding energy and effective masses for charge carriers in organic-inorganic tri-halide perovskites, Nat. Phys. 11 (2015) 582-587. doi:10.1038/nphys3357.

[2] M. M Lee, J Teuscher, T Miyasaka, T. N Murakami, J J Snaith, Efficient Hybrid Solar Cells Based on Meso-Superstructured Organometal Halide Perovskites, Science (80-.). 338 (2012) 643-647. doi:10.1126/science.1228604.

[3] G. E. Eperon, S. D. Stranks, C. Menelaou, M. B. Johnston, L. M. Herz, H. J. Snaith, Formamidinium lead trihalide: A broadly tunable perovskite for efficient planar heterojunction solar cells, Energy Environ. Sci. 7 (2014) 982-988. doi:10.1039/c3ee43822h.

[4] S. D. Stranks, G. E. Eperon, G. Grancini, C. Menelaou, M. J. P. Alcocer, T. Leijtens, L. M. Herz, A. Petrozza, H. J. Snaith, Electron-Hole Diffusion Lengths Exceeding Trihalide Perovskite Absorber, Science (80-.). 342 (2013) 341-344. doi:10.1126/science.1243982.

[5] C. Kim, S. Ryu, J. Seo, S. I. Il Seok, W. S. Yang, J. H. Noh, N. J. Jeon, Y. C. Kim, S. Ryu, J. Seo, S. I. Il Seok, High-performance photovoltaic perovskite layers fabricated through intramolecular exchange, Science (80-.). 348 (2015) 1-12. doi:10.1126/science.aaa9272.

[6] K. X. Steirer, P. Schulz, G. Teeter, V. Stevanovic, M. Yang, K. Zhu, J. J. Berry, Defect Tolerance in Methylammonium Lead Triiodide Perovskite, ACS Energy Lett. 1 (2016) 360-366. doi:10.1021/acsenergylett.6b00196.

[7] NREL, Best Research-Cell Efficiency Chart, (2019). https://www.nrel.gov/pv/cell-efficiency.html.

[8] Z. Song, S. C. Watthage, A. B. Phillips, B. L. Tompkins, R. J. Ellingson, M. J. Heben, Impact of Processing Temperature and Composition on the Formation of Methylammonium Lead Iodide Perovskites, Chem. Mater. 27 (2015) 4612-4619. doi:10.1021/acs.chemmater.5b01017.

[9] J. Prakash, A. Singh, G. Sathiyan, R. Ranjan, A. Singh, Progress in tailoring perovskite based solar cells through compositional engineering: Materials properties, photovoltaic performance and critical issues, Mater. Today Energy. 9 (2018) 440-486. doi:10.1016/j.mtener.2018.07.003.

[10] L. Huang, P. Su, J. Liu, J. Huang, Y. Chen, S. Qin, J. Guo, Y. Xu, C. Su, Interface engineering of perovskite solar cells with multifunctional polymer interlayer toward improved performance and stability, J. Power Sources. 378 (2018) 483-490. doi:10.1016/j.jpowsour.2017.12.082.

[11] Q. Wang, C. Bi, J. Huang, Doped hole transport layer for efficiency enhancement in planar heterojunction organolead trihalide perovskite solar cells, Nano Energy. 15 (2015) 275-280. doi:10.1016/j.nanoen.2015.04.029.

[12] Z. Song, A. B. Phillips, M. J. Heben, Z. Song, S. C. Watthage, A. B. Phillips, M. J. Heben, Z. Song, S. C. Watthage, A. B. Phillips, Pathways toward high-performance perovskite solar cells: review of recent advances in organo-metal halide perovskites for photovoltaic applications, 6 (2019). doi:10.1117/1.JPE.6.022001.

[13] S. Shi, Y. Li, X. Li, H. Wang, Advancements in all-solid-state hybrid solar cells based on organometal halide perovskites, Mater. Horizons. 2 (2015) 378-405. doi:10.1039/c4mh00236a.

[14] G. E. Eperon, V. M. Burlakov, P. Docampo, A. Goriely, H. J. Snaith, Morphological control for high performance, solution-processed planar heterojunction perovskite solar cells, Adv. Funct. Mater. 24 (2014) 151-157. doi:10.1002/adfm.201302090.

[15] Y. Jiang, C. Wu, L. Li, K. Wang, Z. Tao, F. Gao, W. Cheng, J. Cheng, X. Y. Zhao, S. Priya, W. Deng, All electrospray printed perovskite solar cells, Nano Energy. 53 (2018) 440-448. doi:10.1016/j.nanoen.2018.08.062.

[16] Q. Cao, S. Yang, Q. Gao, L. Lei, Y. Yu, J. Shao, Y. Liu, Fast and Controllable Crystallization of Perovskite Films by Microwave Irradiation Process, Applied Materials and Interfaces (2016). doi:10.1021/acsami.6b01558.

[17] A. Dualeh, N. Tétreault, T. Moehl, P. Gao, M. K. Nazeeruddin, M. Grätzel, Effect of annealing temperature on film morphology of organic-inorganic hybrid perovskite solid-state solar cells, Adv. Funct. Mater. 24 (2014) 3250-3258. doi:10.1002/adfm.201304022.

[18] Z. Xiao, Q. Dong, C. Bi, Y. Shao, Y. Yuan, J. Huang, Solvent Annealing of Perovskite-Induced Crystal Growth for Photovoltaic-Device Efficiency Enhancement, Adv. Mater. 26 (2014) 6503-6509. doi:10.1002/adma.201401685.

[19] C. Liu, K. Wang, C. Yi, X. Shi, A. W. Smith, X. Gong, A. J. Heeger, Efficient Perovskite Hybrid Photovoltaics via Alcohol-Vapor Annealing Treatment, Adv. Funct. Mater, (2016) 101-110. doi:10.1002/adfm.201504041.

[20] B. Li, T. Jiu, C. Kuang, S. Ma, Q. Chen, X. Li, J. Fang, Chlorobenzene vapor assistant annealing method for fabricating high quality perovskite films, Org. Electron. 34 (2016) 97-103. doi:10.1016/j.orgel.2016.04.024.

[21] J. Luo, R. Z. Qiu, Z. S. Yang, Y. X. Wang Q. F Zhang, Mechanism and effect of g-butyrolactone solvent vapor post-annealing on the performance of a mesoporous perovskite solar cell, RSC Advances (2018) 724-731. doi:10.1039/c7ra10695e.

[22] J. Xiao, Y. Yang, X. Xu, J. Shi, L. Zhu, S. Lv, H. Wu, Y. Luo, D. Li, Q. Meng, Pressure-assisted CH3NH3PbI3 morphology reconstruction to improve the high performance of perovskite solar cells, J. Mater. Chem. A. 3 (2015) 5289-5293. doi:10.1039/c4ta06700b.

[23] M Ahmadian-Yazdi, M Habibi, M Eslamian, Excitation of Wet Perovskite Films by Ultrasonic Vibration Improves the Device Performance, Appl. Sci. 8 (2018) 308. doi:10.3390/app8020308.

[24] H. Xiong, F. Zabihi, H. Wang, Q. Zhang, M. Eslamian, Grain engineering by ultrasonic substrate vibration post-treatment of wet perovskite films for annealing-free, high performance, and stable perovskite solar cells, Nanoscale. 10 (2018) 8526-8535. doi:10.1039/c8nr00540k.

[25] K.-L. Wang, C.-C. Zhang, Y.-R. Jiang, H.-R. Liu, X.-M. Li, S. M. Jain, H. Ma, High-quality perovskite films via post-annealing microwave treatment, New J. Chem. (2019) 36-38. doi:10.1039/c8nj05941a.

[26] J Troughton, C Charbonneau, M. J. Carnie, M. L. Davies, D. A. Worsley, T. M. Watson, Rapid processing of perovskite solar cells in under 2.5 seconds, Materials Chemistry A, (2015) 9123-9127. doi:10.1039/c5ta00568j.

[27] G. Annohene, G. C. Tepper, Low temperature formation of CH3NH3PbI3 perovskite films in supercritical carbon dioxide, J. Supercrit. Fluids. 154 (2019) 104604. doi:10.1016/j.supflu.2019.104604.

[28] S. S. Dinachali, W. Bai, K. Tu, H. K. Choi, J. Zhang, M. E. Kreider, L. Cheng, C. A. Ross, Thermo-Solvent Annealing of Polystyrene-Polydimethylsiloxane Block Copolymer Thin Films, ACS Macro Letters (2015). doi:10.1021/acsmacrolett.5b00108.

[29] T. P Lodge, M. C. Dalvi, Mechanisms of chain diffusion in lamellar block copolymers, Physical R. Letters, 75 (1995) 657-660.

[30] K. W. Gotrik, C. A. Ross, Solvothermal Annealing of Block Copolymer Thin Films, Nano Letters (2013). doi:10.1021/nl4021683.

[31] H. Ren, J. Song, Q. Xu, J. Yin, Solubility of the silver nitrate in supercritical carbon dioxide with ethanol and ethylene glycol as double co-solvents: Experimental determination and correlation, Chinese J. Chem. Eng. 27 (2019) 400-404. doi:10.1016/j.cjche.2018.06.011.

[32] D. K Joshi, J. M Prausnitz, Supercritical Fluid Extraction with Mixed Solvents, AIChE Journal 30, (1984) 522-525.

[33] R. G. Bitencourt, F. A. Cabral, A. J. A. Meirelles, Ferulic acid solubility in supercritical carbon dioxide, ethanol and water mixtures, J. Chem. Thermodyn. 103 (2016) 285-291. doi:10.1016/j.jct.2016.08.025.

[34] S. Zhan, S. Li, Q. Zhao, W. Wang, J. Wang, Measurement and Correlation of Curcumin Solubility in Supercritical Carbon Dioxide, J. Chem. Eng. data (2017). doi:10.1021/acs.jced.6b00798.

[35] D. L. Gurina, M. L. Antipova, E. G. Odintsova, V. E. Petrenko, Fluids The study of peculiarities of parabens solvation in methanol- and acetone-modified supercritical carbon dioxide by computer simulation, J. Supercrit. Fluids. 126 (2017) 47-54. doi:10.1016/j.supflu.2017.02.008.

[36] Y. Ting, C. Hsieh, Prediction of solid solute solubility in supercritical carbon dioxide with organic co-solvents from the PR+COSMOSAC equation of state, Fluid Phase Equilib. 431 (2017) 48-57. doi:10.1016/j.fluid.2016.10.008.

[37] M. P. Ekart, K. L. Bennett, S. M. Ekart, G. S. Gurdial, C. L. Liotta, C. A. Eckert, Co-solvent Interactions in Supercritical Fluid Solutions, AIChE Journal 39 (1993) 235-248.

[38] D. L. Tomasko, B. L. Knutson, F. Pouillot, C. L. Liotta, C. A. Eckert, Spectroscopic study of structure and interactions in co-solvent-modified supercritical fluids, J. Phys. Chem. (1993) 11823-11834. doi:10.1021/j100147a041.

[39] W. Wu, J. Ke, M. Poliakoff, Phase Boundaries of CO 2+Toluene, CO 2+Acetone, and CO 2+Ethanol at High Temperatures and High Pressures, 2 (2006) 1398-1403. doi:10.1021/je060099a.

[40] H. Yang, C. Zhong, Modeling of the solubility of aromatic compounds in supercritical carbon dioxide-cosolvent systems using SAFT equation of state, 33 (2005) 99-106. doi:10.1016/j.supflu.2004.05.008.

[41] M. Skerget, L. Christoph, Vapor—liquid equilibrium of binary CO 2—organic solvent systems, 43 (2008) 383-389. doi:10.1016/j.supflu.2007.07.020.

[42] M. Chanda, Introduction to polymer science and chemistry, (pp 148), CRC Press, Florida, 2006.

[43] N. Ahn, D. Y. Son, I. H. Jang, S. M. Kang, M. Choi, N. G. Park, Highly Reproducible Perovskite Solar Cells with Average Efficiency of 18.3% and Best Efficiency of 19.7% Fabricated via Lewis Base Adduct of Lead(II) Iodide, J. Am. Chem. Soc. 137 (2015) 8696-8699. doi:10.1021/jacs.5b04930.

[44] A. Kaleva, S. Heinonen, J.-P. Nikkanen, E. Levänen, Synthesis and crystallization of titanium dioxide in supercritical carbon dioxide (scCO2), TOP Conf. Ser. Mater. Sci. Eng. 175 (2017). doi:doi:10.1088/1757-899X/175/1/012034.

[45] T. Oku, Crystal Structures of CH3NH3PbI3 and related perovskite compounds used for solar cells, http://dx.doi.org/10.5772/59284

[46] Q. Chen, H. Zhou, Z. Hong, S. Luo, H. Duan, H. Wang, Y. Liu, G. Li, Y. Yang, Planar Heterojunction Perovskite Solar Cells via Vapor-Assisted Solution Process, J. Am. Chem. Soc (2014) 622-625. doi:10.1021/ja411509g.

[47] G. Yang, C. Wang, H. Lei, X. Zheng, P. Qin, L. Xiong, X. Zhao, Y. Yan, G. Fang, Interface engineering in planar perovskite solar cells: energy level alignment, perovskite morphology control and high performance achievement, J. Mater. Chem. A (2017) 1658-1666. doi:10.1039/c6ta08783c.

[48] Y. Wang, M. Zhong, L. Chai, Effects of the concentration of PbI2 and CH3NH3I on the perovskite films and the performance of perovskite solar cells based on ZnO—TiO2 nanorod arrays, Superlattices and Microstructures 123 (2018) 189-200. doi:10.1016/j.spmi.2018.07.024.

[49] G. Zheng, C. Zhu, J. Ma, X. Zhang, G. Tang, R. Li, Y. Chen, L. Li, J. Hu, J. Hong, Q. Chen, X. Gao, H. Zhou, Manipulation of facet orientation in hybrid perovskite polycrystalline films by cation cascade, Nat. Commun. (2018) 1-11. doi:10.1038/s41467-018-05076-w.

[50] F. Guo, B Zhang, J. Wang, H Bai, R. Guo, Y Huang, P Ren, Facile solvothermal method to synthesize hybrid perovskite CH3NH3PbX3 (X=I, Br, Cl) crystals, Optical materials express 7 (2017) 4156-4162.

[51] X. Guo, C. Mccleese, C. Kolodziej, A. C. S. Samia, Y. Zhao, C. Burda, Identification and characterization of the intermediate phase in hybrid organic-inorganic MAPbI3 perovskite, Dalton Trans (2016) 3806-3813. doi:10.1039/c5dt04420k.

[52] J. Im, I. Jang, N Pellet, M Gratzel, N Park, Growth of CH3NH3PbI3 size for high-efficiency perovskite solar cells, Nat. Nanotechnol. 9 (2014) 927-932. doi:10.1038/nnano.2014.181.

[53] W. Li, J. Fan, J. Li, Y. Mai, L. Wang, Controllable Grain Morphology of Perovskite Absorber Film by Molecular Self-Assembly toward Efficient Solar Cell Exceeding 17%, J. Am. Chem. Soc (2015) 10399-10405. doi:10.1021/jacs.5b06444.

[54] Q. Chen, H. Zhou, T. Song, S. Luo, Z. Hong, H. Duan, L. Dou, Y. Liu, Y. Yang, Controllable Self-Induced Passivation of Hybrid Lead Iodide Perovskites toward High Performance Solar Cells, Nano Lett. (2014). doi:10.1021/nl501838y.

[55] C. Xin, X. Zhou, F. Hou, Y. Du, W. Huang, B. Shi, C. Wei, Y. Ding, G. Wang, G. Hou, Y. Zhao, Y. Li, X. Zhang, Scalable and efficient perovskite solar cells prepared by grooved roller coating, J. Mater. Chem. A (2019), 7 1870-1877. doi:10.1039/c8ta10092f.

We claim:

1. A method to produce perovskite films of the following formula: $AMX_3$ comprising,
   depositing inorganic-organic or all inorganic precursors onto a substrate, wherein said depositing step produces a film of a perovskite precursor solution, then
   exposing the film of the perovskite precursor solution to a supercritical fluid at a temperature equal to or less than 50° C., and then
   inducing crystallization of perovskite crystals in the film of the perovskite precursor solution so as to produce a film with perovskite crystals, of the formula: $AMX_3$, wherein,
   A is an organic cationic ammonium compound or an inorganic cation;
   M is at least one divalent metal; and
   X is halide selected from the group consisting of F, Cl, Br, and I.

2. The method of claim 1, wherein the organic cationic ammonium compound is selected from the group consisting of methylammonium, tetramethylammonium, formamidinium and guanidinium.

3. The method of claim 1, wherein the inorganic cation is selected from the group consisting of $Cs^+$, $Na^+$ and $K^+$.

4. The method of claim 1, wherein the supercritical fluid exposure step is conducted at temperature in the range of from 10° C. to 50° C.

5. The method of claim 1 where the pressure of the supercritical fluid is in the range of 1100 Psi to 2000 Psi.

6. The method of claim 1 wherein the substrate coated with the film of the perovskite precursor solution are placed within a pressure vessel when exposed to the supercritical fluid.

7. The method of claim 1 where the substrate is comprised of a glass or other optically transparent material coated with one or more layers of a thin film photovoltaic device.

8. The method of claim 1 wherein the supercritical fluid is selected from the group consisting of $CO_2$, methane, ethylene, propane, and propylene, alone or in combination with a co-solvent.

9. The method of claim 8 wherein the exposure step is conducted with a co-solvent selected from a group consisting of benzene, toluene, dichloromethane, hexane, xylene, tetrahydrofuran, acetone, dimethyl sulfoxide, dimethylformamide, ethanol, isopropanol, methanol, and ethylene glycol.

10. The method of claim 8, wherein the co-solvent is an organic solvent.

11. The method of claim 1 wherein the supercritical fluid is $CO_2$.

12. The method of claim 1, wherein the exposure step is conducted with supercritical $CO_2$ combined with a co-solvent.

13. The method of claim 12, wherein the co-solvent selected from a group consisting of benzene, toluene, dichloromethane, hexane, xylene, tetrahydrofuran, acetone, dimethyl sulfoxide, dimethylformamide, ethanol, isopropanol, methanol, and ethylene glycol.

14. The method of claim 12, wherein the exposure step is conducted in the co-solvent at a v/v % concentration in the range of 0.1 to 2.0%.

15. The method of claim 1, wherein the film with perovskite crystals has the formula $CH_3NH_3PbX_3$, wherein, X is a halide selected from the group consisting of F, Cl, Br, and I.

16. The method of claim 15, wherein the film with perovskite crystals has the formula $CH_3NH_3PbI_3$.

17. The method of claim 1, wherein the perovskite crystals possess an average grain size ranging from 200 to 1000 mm.

18. The method of claim 1, wherein the perovskite crystals possess an average grain size of 200 nm, 250 nm, 400 nm, or 600 nm.

* * * * *